United States Patent
Xia et al.

(10) Patent No.: US 11,217,131 B2
(45) Date of Patent: Jan. 4, 2022

(54) FLEXIBLE CIRCUIT BOARD AND TEST FIXTURE

(71) Applicant: WuHan TianMa Micro-Electronics Co., Ltd., Wuhan (CN)

(72) Inventors: Huijian Xia, Wuhan (CN); Ning Xu, Wuhan (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 228 days.

(21) Appl. No.: 16/672,534

(22) Filed: Nov. 4, 2019

(65) Prior Publication Data

US 2020/0068707 A1 Feb. 27, 2020

(30) Foreign Application Priority Data

Jun. 28, 2019 (CN) .......................... 201910580657.2

(51) Int. Cl.
*H05K 1/02* (2006.01)
*G09G 3/00* (2006.01)
*H05K 1/18* (2006.01)

(52) U.S. Cl.
CPC .......... *G09G 3/006* (2013.01); *H05K 1/0281* (2013.01); *H05K 1/189* (2013.01); *G09G 2330/12* (2013.01); *G09G 2380/02* (2013.01);
(Continued)

(58) Field of Classification Search
CPC ........ H05K 1/02; H05K 1/028; H05K 1/0222; H05K 1/0281; H05K 1/0268; H05K 1/11;
(Continued)

(56) References Cited

U.S. PATENT DOCUMENTS 6,211,936 B1 * 4/2001 Nakamura .......... G02F 1/13452
349/149
7,459,789 B2 * 12/2008 Kim ...................... H05K 3/361
257/773
(Continued)

FOREIGN PATENT DOCUMENTS

CN          203416496 U      1/2014
CN          205266019 U      5/2016
(Continued)

*Primary Examiner* — Tuan T Dinh
(74) *Attorney, Agent, or Firm* — Kilpatrick Townsend & Stockton, LLP

(57) ABSTRACT

The present disclosure relates to the field of circuit testing technologies and discloses a flexible circuit board and a test fixture. The flexible circuit board comprises: a flexible body which has a first crimping portion and an extension portion, the first crimping portion being used to be laminated with a second crimping portion of a substrate to be tested; a first electrically connected structure which is located on a first side of the flexible body, arranged on the first crimping portion, and used to be laminated with a second electrically connected structure on the second crimping portion; a support structure which is located on the first side of the flexible body and includes a first support portion and a second support portion; the first support portion is arranged on the extension portion and configured to support the extension portion in the laminating state.

18 Claims, 5 Drawing Sheets

(52) U.S. Cl.
CPC ..... *H05K 2201/02* (2013.01); *H05K 2201/05* (2013.01); *H05K 2201/09181* (2013.01); *H05K 2201/10128* (2013.01)

(58) Field of Classification Search
CPC . H05K 1/14; H05K 1/18; H05K 1/118; H05K 1/181–189; H05K 3/36; H05K 3/361; H05K 2201/02; H05K 2201/05; G09G 3/00; G09G 3/006; G02F 1/13451
USPC ........ 361/690–710, 749, 770–790, 792–795, 361/803; 174/250–258; 349/149–152
See application file for complete search history.

(56) References Cited

U.S. PATENT DOCUMENTS

| | | | |
|---|---|---|---|
| 8,058,956 B2* | 11/2011 | Jow | H05K 1/0222 |
| | | | 333/260 |
| 8,115,370 B2* | 2/2012 | Huang | F21K 9/00 |
| | | | 313/46 |
| 2005/0183884 A1* | 8/2005 | Su | H05K 3/361 |
| | | | 174/257 |
| 2014/0355228 A1* | 12/2014 | Shi | H05K 3/36 |
| | | | 361/749 |
| 2016/0026030 A1* | 1/2016 | Kang | G02F 1/13452 |
| | | | 349/58 |

FOREIGN PATENT DOCUMENTS

| | | |
|---|---|---|
| CN | 107422931 A | 12/2017 |
| CN | 108388054 A | 8/2018 |
| KR | 20090062078 A | 6/2009 |

* cited by examiner

FLEXIBLE CIRCUIT BOARD AND TEST FIXTURE

This application claims the benefit of Chinese Patent Application No. 201910580657.2, filed with the Chinese Patent Office on Jun. 28, 2019, and entitled "Flexible circuit board and test fixture", which is hereby incorporated by reference in its entirety.

FIELD OF INVENTION

The present disclosure relates to the field of circuit testing technologies, and particularly to a flexible circuit board and a test fixture.

BACKGROUND

Generally, the test method of the circuit unit visualization (Cell Visual) of the display panel product is as follows: the individual sub-pixels in the panel are connected with the common electrode (Vcom) respectively and then connected to the corresponding probe test terminals (Pad) on the panel respectively, the gate line (Gate) signals are connected to the test terminals on the panel in the same way, and then the corresponding signals are applied to the individual test terminals on the panel by pressing the probes thereon to enable the panel to display the frames, so that it is detected whether the individual Thin Film Transistors (TFTs) in the panel run normally and whether the wirings of the gate line (Gate) and the data line (Source) is normal, to thereby prevent the bad product from flowing into the module section which wastes the cost.

Generally, there is enough space to place the test probe (Pad) at the edge step of the large display panel, but for some panel products such as small panel or Active Matrix Organic Light-Emitting Diode (AMOLED) panel product, after arranging the Integrated Circuit (IC) at the edge step, there is no enough space to place the test terminals at the left and right steps. At this time, the signal line is generally pulled to the connected region of the Flexible Printed Circuit (FPC), which is also referred to as FOG (FPC on glass), and the Cell Visual test is performed by way of the false pressure flexible circuit board. The false pressure test process In one embodiment includes: placing the substrate to be tested on the test platform, and laminating the crimping portion of the flexible circuit board on the crimping portion (which is generally a step) of the substrate to be tested by the squeeze head, so that the electrically connected structure on the crimping portion of the flexible circuit board is laminated with the electrically connected structure on the crimping portion of the substrate to be tested, and thus the corresponding signal can be applied to the panel by the flexible circuit board to enable the panel to display the frames. However, when the flexible circuit board is laminated in the false pressure test process, the flexible circuit board may often shift, so that it is easy to cause the poor lamination of the electrically connected structure on the crimping portion of the flexible circuit board with the electrically connected structure on the crimping portion of the substrate to be tested, and even the misconnection and short-circuit case may occur, which severely affects the actual laminating effect and the test success rate.

BRIEF SUMMARY

The disclosure describes a flexible circuit board and a test fixture so as to improve the laminating effect and the test success rate of the false pressure test of the flexible circuit board.

Embodiments of the present disclosure include, a flexible circuit board which includes: a flexible body which has a first crimping portion and an extension portion arranged successively in an extension direction, the first crimping portion being used to be laminated with a second crimping portion of a substrate to be tested; a first electrically connected structure which is located on a first side of the flexible body, arranged on the first crimping portion, and used to be laminated with a second electrically connected structure on the second crimping portion; a support structure which is located on the first side of the flexible body and includes a first support portion and a second support portion; and the first support portion is arranged on the extension portion and configured to support the extension portion in a state of laminating the first crimping portion with the second crimping portion, so that levels of the extension portion and the first crimping portion are same; the second support portion is arranged on the first crimping portion and configured to be supported between the first crimping portion and the second crimping portion in the state of laminating the first crimping portion with the second crimping portion, so as to isolate the first crimping portion from the second crimping portion.

In one embodiment, the thickness of the first support portion is same as the sum of the thicknesses of the second crimping portion and the second electrically connected structure.

In one embodiment, the difference value between the thickness of the first support portion and the sum of the thicknesses of the second crimping portion and the second electrically connected structure is not more than 15 μm.

In one embodiment, the extension portion is provided with a positioning hole, the projection of the first support portion on the extension portion covers the positioning hole, and the first support portion is provided with an installation hole corresponding to the positioning hole.

In one embodiment, the projection of the side edge of the first support portion close to the first crimping portion on the flexible body is aligned with the boundary of the first crimping portion and the extension portion.

In one embodiment, in the direction of the boundary, the width of the first support portion is equal to the width of the extension portion.

In one embodiment, the projection of the second support portion on the first crimping portion covers all the regions on the first crimping portion except for the projection region of the first electrically connected structure.

In one embodiment, the thickness of the second support portion is less than the thickness of the first electrically connected structure.

In one embodiment, the support structure is an one-piece structure.

In one embodiment, the support structure is of insulating materials.

In one embodiment, the support structure is of flexible materials.

In one embodiment, the materials of the support structure include silicone and rubber.

In one embodiment, the support structure is laminated with the flexible body.

In one embodiment, the substrate to be tested includes a display substrate and a circuit board.

In one embodiment, the substrate to be tested is a display substrate; the substrate to be tested includes a third electrically connected structure arranged on the second crimping portion, the third electrically connected structure being an electrically connected structure for a display driver;

the flexible body is provided with a notch avoiding the third electrically connected structure.

In one embodiment, the second crimping portion is arranged at one end of the substrate to be tested in the first direction which is perpendicular to two opposite sides of the substrate to be tested; the second electrically connected structure includes two-part connection terminals, where in the second direction orthogonal to the first direction, the two-part connection terminals are located at two sides of the third electrically connected structure respectively.

In one embodiment, the notch is of the concave shape.

A test fixture includes the flexible circuit board of any one of the above.

The beneficial effects of the solution:

In the flexible circuit board provided by the disclosure, the flexible body is designed with the stack-up support structure which is on the same surface as the first electrically connected structure (false pressure gold finger), i.e., arranged on the side of the laminating surface of the flexible body.

In one embodiment, the above support structure includes the first support portion located on the extension portion, where the first support portion can support the extension portion of the flexible circuit board in the state of laminating the first crimping portion of the flexible circuit board with the second crimping portion of the substrate to be tested, so that the levels of the extension portion and the first crimping portion are the same, so as to compensate the height segment gap of the extension portion of the flexible circuit board, avoid the extension portion of the flexible circuit board from bending and shifting downward in the laminating process, and then avoid the crimping portion of the flexible circuit board from shifting. Thus, the actual crimping effect of the first electrically connected structure of the flexible circuit board and the second electrically connected structure of the substrate to be tested may be improved, the wrong connection or short connection of the first electrically connected structure with the second electrically connected structure may also be avoided, and then the laminating effect of the circuit unit test (Cell Visual) can be improved effectively and the success rate of the false pressure test can be increased.

In one embodiment, the residual conductor may often be produced on the second crimping portion when the one-piece cutting is performed on the glass substrate of the second crimping portion. In the laminating state, there is a gap between the first crimping portion and the second crimping portion, and it is easy for the residual conductor to form the conductive path in the gap, which may cause certain connection terminals of the first electrically connected structure to connect with some non-corresponding connection terminals or wires on the second crimping portion, and thus cause the occurrence of the short-circuit case. In the solution of the disclosure, the support structure further includes the second support portion on the first crimping portion. In the state of laminating the first crimping portion with the second crimping portion, the second support portion covers the second crimping portion, the gap between the first crimping portion and the second crimping portion is filled, and the first crimping portion is isolated from the second crimping portion, avoiding the first crimping portion from contacting with the residual conductor. Thus, the residual conductor can be avoided from forming the conductive path between the first crimping portion and the second crimping portion, the occurrence of the short-circuit case due to the residual conductor can be avoided effectively, and then the laminating effect of the circuit unit test can further be improved and the success rate of the false pressure test can be increased.

In one embodiment, since the above support structure is arranged under and formed integrally with the flexible body, the strength of the flexible body can be increased, which has the effect of strengthen the flexible circuit board, and can thus prevent the avulsion of the flexible circuit board during the assembly and use, and effectively increase the service life and the reliability of the flexible circuit board.

DETAILED DESCRIPTION OF THE EMBODIMENTS

Figure 1:
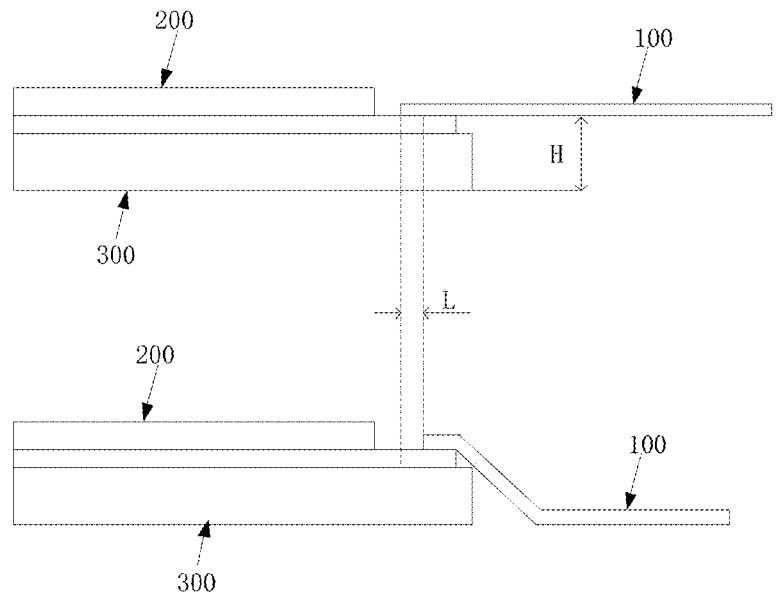
FIG. 1 is a schematic diagram of structural state of the flexible circuit board and the test substrate in the false pressure test process of the related technology.

The inventor found by the long-term test that, when the flexible circuit board is laminated in the false pressure test process, the flexible circuit board may often shift, so that it is easy to cause the poor lamination of the electrically connected structure on the crimping portion of the flexible circuit board with the electrically connected structure on the crimping portion of the substrate to be tested, and even the misconnection and short-circuit case may occur, which severely affects the actual laminating effect and the test success rate. The inventor found after the research that, the reason why the flexible circuit board shifts is mainly the height offset H between the flexible circuit board 100 and the panel 300, as shown in FIG. 1. Due to the height offset H, in the laminating process, the flexible circuit board 100 is easy to bend and shift downward and thus the flexible circuit board 100 shifts relative to the preset laminating position by the offset L, which, on the one hand, may affect the actual laminating effect of the electrically connected structure of the flexible circuit board 100 and the electrically connected structure of the substrate to be tested 200, and on the other hand, may further cause the wiring misconnection or short circuit of the electrically connected structure of the flexible circuit board 100 and the electrically connected structure of the substrate to be tested 200, thus affecting the test success rate. For the problem presenting in the above false pressure test, the disclosure proposes a new flexible circuit board and test fixture so as to improve the laminating effect and the test success rate of the false pressure test.

Figure 2:
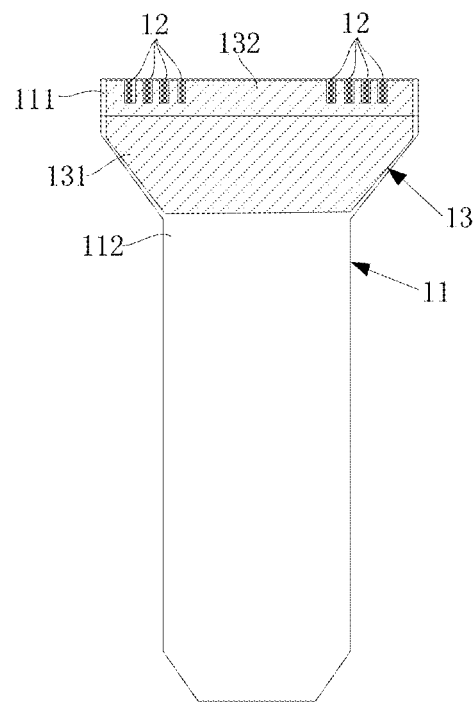
FIG. 2 is a structural schematic diagram of a flexible circuit board provided by an embodiment of the disclosure.
Figure 3:
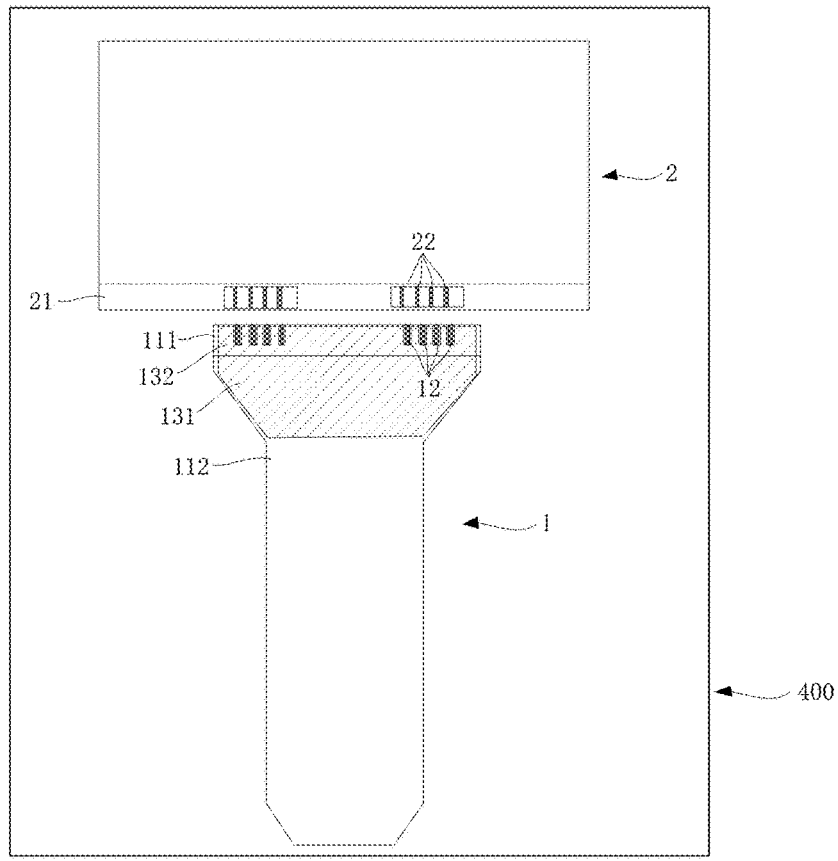
FIG. 3 is a top structural schematic diagram of a flexible circuit board provided by an embodiment of the disclosure in the false pressure test state.
Figure 4:
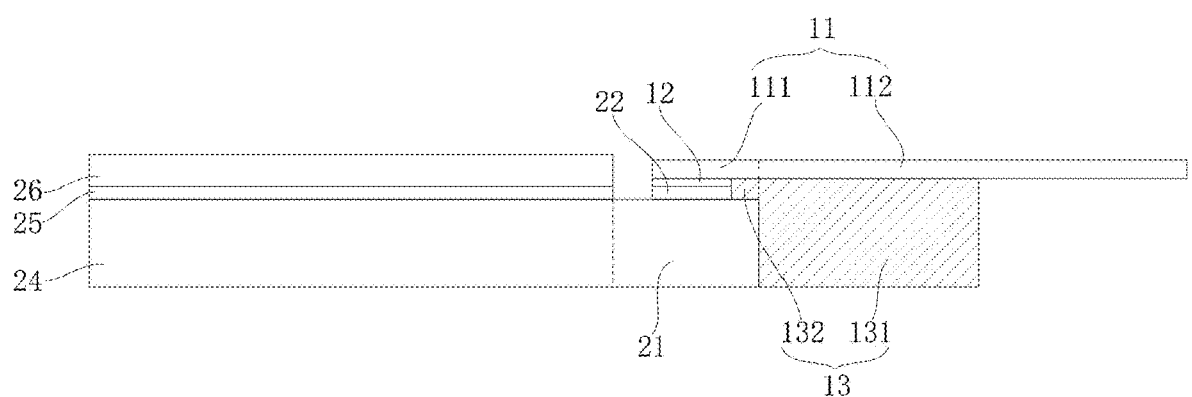
FIG. 4 is a structural schematic diagram of longitudinal cross-section of a flexible circuit board provided by an embodiment of the disclosure in the false pressure test state.

As shown in FIGS. 2 to 4, the embodiments of the disclosure provide a flexible circuit board 1 which includes a flexible body 11, a first electrically connected structure 12 and a support structure 13; and:

the flexible body 11 has a first crimping portion 111 and an extension portion 112 arranged successively in the extension direction, the first crimping portion 111 being used to be laminated with a second crimping portion 21 of a substrate to be tested 2;

the first electrically connected structure 12 is located on the first side of the flexible body 11, arranged on the first crimping portion 111, and used to be laminated with a second electrically connected structure 22 on the second crimping portion 21;

the support structure 13 is located on the first side of the flexible body 11 and includes a first support portion 131 and a second support portion 132; and the first support portion 131 is arranged on the extension portion 112 and configured to support the extension portion 112 in the state of laminating the first crimping portion 111 with the second crimping portion 21, so that the levels of the extension portion 112 and the first crimping portion 111 are same; the second support portion 132 is arranged on the first crimping portion 111 and configured to be supported between the first crimping portion 111 and the second crimping portion 21 in the state of laminating the first crimping portion 111 with the second crimping portion 21, so as to isolate the first crimping portion 111 from the second crimping portion 21.

In the structure of the flexible circuit board 1 provided by the disclosure, the flexible body 11 is designed with the stack-up support structure 13 which is on the same surface as the first electrically connected structure 12 (false pressure gold finger), i.e., arranged on the side of the laminating surface of the flexible body 11.

In one embodiment, the above support structure 13 includes the first support portion 131 located on the extension portion 112, as shown in FIG. 4. In the state of laminating the first crimping portion 111 of the flexible circuit board 1 with the second crimping portion 21 of the substrate to be tested 2, the first support portion 131 can support the extension portion 112 of the flexible circuit board 1, so that the levels of the extension portion 112 and the first crimping portion 111 are the same, so as to compensate the height segment gap of the extension portion 112 of the flexible circuit board 1, avoid the extension portion 112 of the flexible circuit board 1 from bending and shifting downward in the laminating process, and then avoid the crimping portion of the flexible circuit board 1 from shifting. Thus, the actual crimping effect of the first electrically connected structure 12 of the flexible circuit board 1 and the second electrically connected structure 22 of the substrate to be tested 2 may be improved, the wrong connection or short connection of the first electrically connected structure 12 with the second electrically connected structure 22 may also be avoided, and then the laminating effect of the circuit unit test (Cell Visual) can be improved effectively and the success rate of the false pressure test can be increased.

In one embodiment, in the state of laminating the first crimping portion 111 of the flexible circuit board 1 with the second crimping portion 21 of the substrate to be tested 2, there is a gap between the first crimping portion 111 and the second crimping portion 21. The residual conductor may often be produced on the second crimping portion 21 when the one-piece cutting is performed on the glass substrate of the second crimping portion 21. In the laminating state, it is easy for the residual conductor to form the conductive path in the gap between the first crimping portion 111 and the second crimping portion 21, which may cause certain connection terminals of the first electrically connected structure 12 to connect with some non-corresponding connection terminals or wires on the second crimping portion 21 (i.e., the connection terminals of the first electrically connected structure 12 is not only connected with their corresponding connection terminals of the second electrically connected structure 22, but also connected with other non-corresponding connection terminals or wires), and thus cause the occurrence of the short-circuit case. In one embodiment, in the structure of the flexible circuit board 1 provided by the disclosure, the support structure 13 further includes the second support portion 132 on the first crimping portion 111. In the state of laminating the first crimping portion 111 with the second crimping portion 21, the second support portion 132 covers the second crimping portion 21, the gap between the first crimping portion 111 and the second crimping portion 21 is filled, and the first crimping portion 111 is isolated from the second crimping portion 21, avoiding the first crimping portion 111 from contacting with the residual conductor. Thus, the residual conductor can be avoided from forming the conductive path between the first crimping portion 111 and the second crimping portion 21, the occurrence of the short-circuit case due to the residual conductor can be avoided effectively, and then the laminating effect of the circuit unit test can further be improved and the success rate of the false pressure test can be increased.

In one embodiment, since the above support structure 13 is arranged under and formed integrally with the flexible body 11, the strength of the flexible body 11 can be increased, which has the effect of strengthen the flexible circuit board 1, and can thus prevent the avulsion of the flexible circuit board 1 during the assembly and use, and effectively increase the service life and the reliability of the flexible circuit board.

In a specific embodiment, the support structure 13 can be of the flexible materials.

In a specific embodiment, the support structure 13 can be of the insulating materials.

Exemplarily, the materials of the support structure 13 include silicone and rubber.

In the false pressure test operations, the squeeze head is generally employed to laminate the first crimping portion 111 of the flexible circuit board 1 with the second crimping portion 21 of the substrate to be tested 2. The support structure 13 of the flexible circuit board 1 is designed to be flexible, which can avoid the poor lamination due to the rigid support produced by the support structure 13 for the squeeze head; and in the process of laminating the flexible circuit board 1 towards the substrate to be tested 2 by the squeeze head, the buffering effect produced by the flexible support structure 13 can increase the stability and accuracy of the lamination, and thus ensure the laminating effect. Simultaneously, the support structure 13 uses the insulating materials, and then the second support portion 132 can has the good insulation effect between the first crimping portion 111 and the second crimping portion 21, which can effectively avoid the occurrence of the short-circuit case due to the residual conductor.

Figure 5:
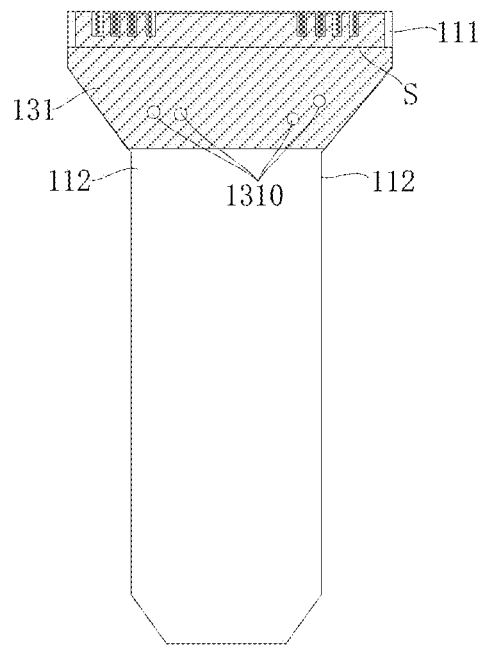
FIG. 5 is a structural schematic diagram of a flexible circuit board provided by another embodiment of the disclosure.

As shown in FIGS. 4 and 5, in a specific embodiment, the support structure 13 can be an one-piece structure. That is, the first support portion 131 and the second support portion 132 are the one-piece structure.

In a specific embodiment, the support structure 13 can be laminated with the flexible body 11. Thus, at the time of non-laminating test, the support structure 13 can be separated from the flexible body 11, so as to be stored, received and used respectively.

Exemplarily, as shown in FIG. 4, during the false pressure operations, the first support portion 131 of the support structure 13 is placed on the test platform, the second support portion 132 is laid on the surface of the second crimping portion 21, and the flexible body 11 is arranged on the support structure 13. Since the first support portion 131 and the second support portion 132 are the one-piece structure and the second support portion 132 is sandwiched between the first crimping portion 111 and the second crimping portion 21, the overall stability of the first support portion 131 and the second support portion 132 can be better, the support structure 13 is uneasy to shift, and thus the stability of the whole flexible circuit board 1 can be increased.

In a specific embodiment, the thickness of the first support portion 131 is same as the sum of the thicknesses of the second crimping portion 21 and the second electrically connected structure 22.

Exemplarily, the difference value between the thickness of the first support portion 131 and the sum of the thicknesses of the second crimping portion 21 and the second electrically connected structure 22 is not more than 15 μm.

Exemplarily, the thickness of the first support portion 131 is about dozens of micrometer.

As shown in FIG. 4, at the time of the false pressure test, the second crimping portion 21 of the substrate to be tested 2 and the first support portion 131 of the flexible circuit board 1 are located on the test platform respectively, the first crimping portion 111 and the extension portion 112 of the flexible circuit board 1 are located on the second crimping portion 21 and the first support portion 131 respectively, and the thickness of the first support portion 131 of the flexible circuit board 1 is same as the sum of the thicknesses of the second crimping portion 21 and the second electrically connected structure 22 of the substrate to be tested 2, so that the extension portion 112 and the first crimping portion 111 of the flexible circuit board 1 can be at the substantially same height, and thus the shifting of the flexible circuit board 1 due to the height segment gap in the laminating process can be avoided, to ensure the laminating effect.

As shown in FIG. 5, in a specific embodiment, the extension portion 112 is provided with a positioning hole, the projection of the first support portion 131 on the extension portion 112 covers the positioning hole, and the first support portion 131 is provided with an installation hole 1310 corresponding to the position of the positioning hole.

In one embodiment, the first support portion 131 covers the positioning hole on the extension portion 112 and is provided with the installation hole 1310 corresponding to the positioning hole, so the positioning pin can pass through the installation hole 1310 of the first support portion 131 and the positioning hole on the extension portion 112 simultaneously, which, on the one hand, can effectively increase the overall strength of the flexible circuit board 1 and prevent the avulsion of the flexible circuit board 1 during the assembly and use, and on the other hand, can improve the positioning effect and avoid the shifting of the flexible circuit board 1.

As shown in FIG. 5, in a specific embodiment, the projection of the side edge of the first support portion 131 close to the first crimping portion 111 on the flexible body 11 is aligned with the boundary of the first crimping portion 111 and the extension portion 112.

In one embodiment, as shown in FIGS. 4 and 5, the second crimping portion 21 of the substrate to be tested 2 is arranged at the end. In the state of laminating the first crimping portion 111 of the flexible circuit board 1 with the second crimping portion 21 of the substrate to be tested 2, the boundary S of the first crimping portion 111 and the extension portion 112 of the flexible circuit board 1 is substantially aligned with the edge of the substrate to be tested 2; the edge of the first support portion 131 is aligned with the above the boundary S, so the edge of the first support portion 131 is adjacent to or contacts with the edge of the substrate to be tested 2 (i.e., the edge of the second crimping portion 21), which can effectively compensate for the height segment gap formed at the edge of the substrate to be tested 2, can form the good support for the part (extension portion 112) of the flexible body 11 beyond the second crimping portion 21, and avoid the shifting in the laminating process.

As shown in FIG. 5, in a specific embodiment, in the direction of the boundary S, the width of the first support portion 131 is equal to the width of the extension portion 112. The strength of the flexible body 11 can be increased better, preventing the avulsion of the flexible circuit board 1 during the assembly and use.

In a specific embodiment, the projection of the second support portion 132 on the first crimping portion 111 covers all the regions on the first crimping portion 111 except for the projection region of the first electrically connected structure 12. In one embodiment, the second support portion 132 covers all the regions on the first crimping portion 111 except for the first electrically connected structure 12, which can avoid the occurrence of the short-circuit case between the first crimping portion 111 and the second crimping portion 21 as possible; in the meantime, the second support portion 132 covers the gaps among all the terminals of the first electrically connected structure 12, which can effectively avoid the short-circuit case among the terminals.

In one embodiment, the thickness of the second support portion 132 is less than the thickness of the first electrically connected structure 12. The second support portion 132 has the smaller thickness and lower support height, may not block the laminating route, and can have an effect on the lamination of the first electrically connected structure 12 with the second electrically connected structure 22.

In a specific embodiment, the substrate to be tested 2 can include a display substrate and a circuit board.

In one embodiment, the flexible circuit board 1 provided by the embodiment of the disclosure can be used for the circuit unit test of the display substrate and can also be applied for the test of the circuit board. Exemplarily, the above flexible circuit board 1 can be used for the test of the architecture product in which the flexible printed circuit is connected on the glass (FOG, FPC ON Glass), can also be used for the test of the architecture product in which the flexible printed circuit is connected on the rigid circuit board (FOB, FPC ON Board), and can also be used for the test of the architecture product in which the flexible printed circuit is connected on the flexible circuit board (FOF, FPC ON Film).

Further, the above flexible circuit board 1 is also applicable to the architecture product in which the chip is bound on the glass (COG, Chip ON Glass), the chip is bound on the flexible circuit board (COF, Chip ON Film), the chip is bound on the flexible substrate (COP, Chip ON Pi) or the like, and the applicable panel field is very wide.

In one embodiment, the substrate to be tested 2 is an active matrix organic light-emitting diode (AMOLED) panel, as shown in FIG. 4, the active matrix organic light-emitting diode panel generally includes a back board and a cover board 26, where the back board includes a base substrate 24 and a TFT array 25 located on the base substrate 24; In one embodiment, the edge of one end of the base substrate 24 goes beyond the edge of the cover board 26, the part of the base substrate 24 beyond the cover board 26 forms the second crimping portion 21, and the second electrically connected structure 22 is located on the second crimping portion 21 and In one embodiment arranged in the same layer as the TFT array 25 on the display area and connected with each TFT in the TFT array 25 by the wirings. In the false pressure test operations, the first crimping portion 111 of the flexible circuit board 1 is In one embodiment laminated on the second crimping portion 21 of the array substrate to achieve the signal connection. Exemplarily, the base substrate 24 and the cover board 26 of the active matrix organic light-emitting diode panel described above can be the glass or can be the flexible materials, that is, the active matrix organic light-emitting diode panel described above can be a rigid panel or can be a flexible panel.

Figure 6:
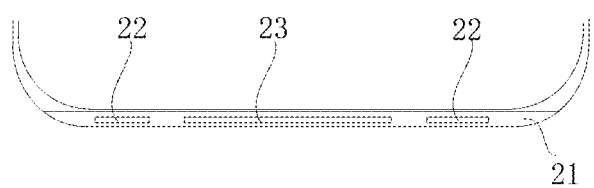
FIG. 6 is a schematic diagram of partial structure of a substrate to be tested provided by an embodiment of the disclosure.

As shown in FIG. 6, in a specific embodiment, the substrate to be tested 2 is the display substrate; the second crimping portion 21 of the substrate to be tested 2 not only has the second electrically connected structure 22, but also has the third electrically connected structure 23, where the second electrically connected structure 22 is the electrically connected structure used for the circuit unit test, and the third electrically connected structure 23 is the electrically connected structure used for the display driver (Display Pad).

Figure 7:
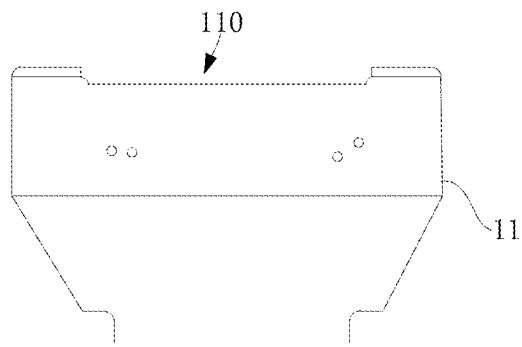
FIG. 7 is a schematic diagram of partial structure of the flexible body of a flexible circuit board provided by an embodiment of the disclosure.

As shown in FIG. 7, in a specific embodiment, the flexible body 11 of the flexible circuit board 1 is provided with a notch 110 avoiding the third electrically connected structure 23 on the substrate to be tested 2.

Figure 8:
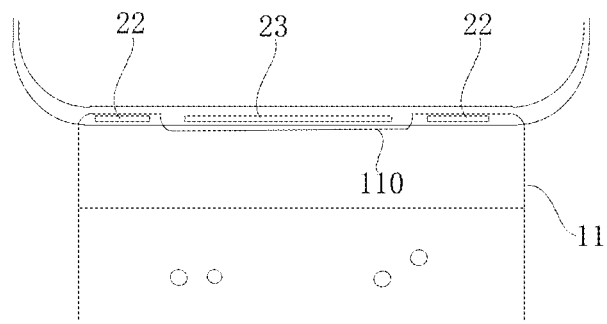
FIG. 8 is a top structural schematic diagram of a flexible circuit board provided by another embodiment of the disclosure in the false pressure test state.

In one embodiment, both of the second electrically connected structure 22 and the third electrically connected structure 23 are arranged on the second crimping portion 21 and at the substantially same level; as shown in FIG. 8, by arranging the avoiding notch 110 on the flexible body 11 of the flexible circuit board 1, it is possible to avoid the flexible circuit board 1 from scratching the third electrically connected structure 23 in the Visual Cell test, prevent the badness due to the scratching of the Display pad by the flexible circuit board 1 in production from flowing into the subsequent module sites, and save the production cost.

Figure 9:
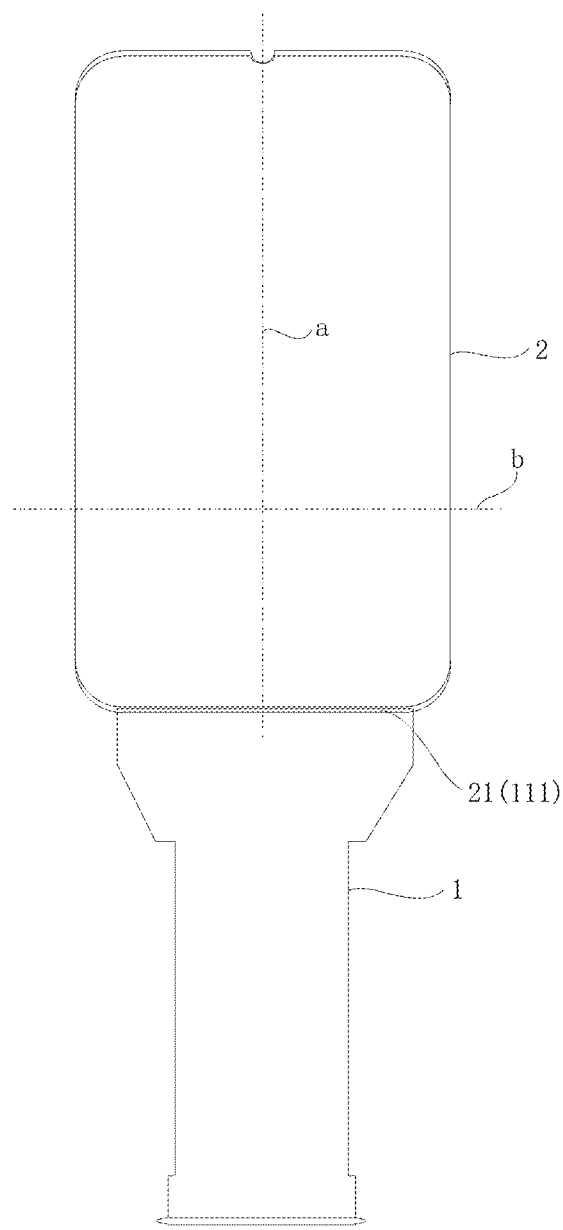
FIG. 9 is a structural schematic diagram of overall top view of a flexible circuit board and a substrate to be tested provided by an embodiment of the disclosure in the false pressure test state.

Exemplarily, as shown in FIGS. 8 and 9, the second crimping portion 21 is arranged at one end of the substrate to be tested 2 in the first direction a which is perpendicular to two opposite sides of the substrate to be tested 2; the second electrically connected structure 22 includes two-part connection terminals, where in the second direction b orthogonal to the first direction a, the two-part connection terminals are located at two sides of the third electrically connected structure 23 respectively.

In one embodiment, the second crimping portion 21 is located at one end of the substrate to be tested 2. In order to facilitate the narrow border design, the smaller width of the second crimping portion 21 is generally better. In one embodiment, the second direction b is perpendicular to the first direction a, that is, the second direction b is parallel to the edge of the end at which the second crimping portion 21 is located; the second electrically connected structure 22 and the third electrically connected structure 23 are designed to arrange and extend along the second direction b, i.e., extend along the edge of the substrate to be tested 2. Then the width design of the second crimping portion 21 only needs to meet the one of the second electrically connected structure 22 and the third electrically connected structure 23 of which the width is larger, and thus the width of the second crimping portion 21 can be designed to be smaller.

Figure 10:
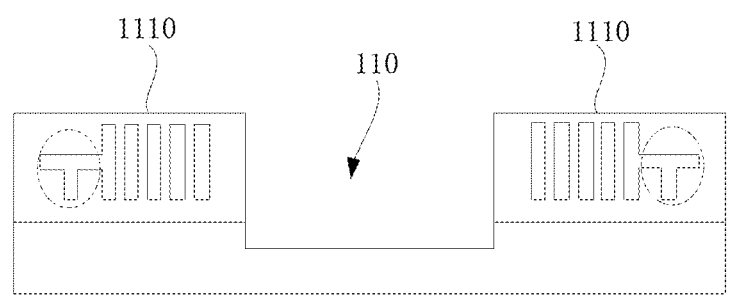
FIG. 10 is a schematic diagram of partially amplified structure of a flexible circuit board provided by an embodiment of the disclosure.

Exemplarily, as shown in FIGS. 7, 8 and 10, the notch 110 on the flexible body 11 is of the concave shape. In one embodiment, the first crimping portion 111 of the flexible body 11 can include two projections 1110 arranged symmetrically. The notch 110 between the two projections 1110 can avoid the third electrically connected structure 23, to avoid the flexible circuit board 1 from scratching the third electrically connected structure 23 in the circuit unit test; further, the first electrically connected structure 12 includes two-part connection terminals which are located on the two projections 1110 of the first crimping portion 111 respectively, and used to be laminated with the two-part connection terminals of the second electrically connected structure 22 respectively.

Exemplarily, as shown in FIG. 10, the two-part connection terminals of the first electrically connected structure 12 are provided with the comparison marks, the ends of the two-part connection terminal (golden finger) away from each other are provided with the counterpoint marks (as shown in FIG. 10, two "T"-shaped golden fingers in the dotted line circles at left and right sides). The microscope is used to observe whether two "T"-shaped counterpoint marks in the two-part connection terminals are aligned with two counterpoint marks of the second electrically connected structure 22 respectively, and if the alignment is confirmed, the flexible circuit board 1 can be laminated with the substrate to be tested 2.

Furthermore, the disclosure further provides a test fixture 400 which includes the flexible circuit board in any one of the above embodiments.

Exemplarily, the test fixture 400 provided by the disclosure may further include a test platform, a squeeze head, a controller and the like. In one embodiment, referring to FIGS. 3 and 4, the operational process of the false pressure test includes: placing the substrate to be tested 2 on the test platform, arranging the first crimping portion 111 of the flexible circuit board above the second crimping portion 21 of the substrate to be tested 2, and fastening the flexible circuit board 1 on the test platform via the positioning pin; then aligning the first electrically connected structure 12 on the first crimping portion 111 with the second electrically connected structure 22 on the second crimping portion 21 by the microscope's observation, and then controlling by the controller the squeeze head to laminate the first electrically connected structure 12 with the second electrically connected structure 22. In this process, the support structure 13 of the flexible circuit board 1 can support the flexible body 11, which, on the one hand, can avoid the shifting of the flexible circuit board 1 due to the height segment gap to increase the lamination accuracy and the lamination effect, and on the other hand, can avoid the occurrence of the short-circuit case; furthermore, since the flexible circuit board 1 includes the support structure 13, the overall strength is increased, thus the avulsion case is uneasy to occur during the assembly and use described above and the reliability is relatively high.

What is claimed is:

1. A flexible circuit board comprising:
   a flexible body including a first crimping portion and an extension portion arranged successively in an extension direction, the first crimping portion is laminated with a second crimping portion of a substrate to be tested;
   a first electrically connected structure located on a first side of the flexible body, arranged on the first crimping portion, and laminated with a second electrically connected structure on the second crimping portion;
   a support structure located on the first side of the flexible body and includes a first support portion and a second support portion;
   wherein the first support portion is arranged on the extension portion and configured to support the extension portion in a state of laminating the first crimping portion with the second crimping portion,
   wherein levels of the extension portion and the first crimping portion are same;
   wherein the second support portion is arranged on the first crimping portion and configured to be supported between the first crimping portion and the second crimping portion in the state of laminating the first crimping portion with the second crimping portion to isolate the first crimping portion from the second crimping portion.

2. The flexible circuit board according to claim 1, wherein the thickness of the first support portion is the sum of the thicknesses of the second crimping portion and the second electrically connected structure.

3. The flexible circuit board according to claim 2, wherein the difference value between the thickness of the first support portion and the sum of the thicknesses of the second crimping portion and the second electrically connected structure is not more than 15 μm.

4. The flexible circuit board according to claim 1, wherein the extension portion is provided with a positioning hole, a projection of the first support portion on the extension portion covers the positioning hole, and the first support portion is provided with an installation hole corresponding to the positioning hole.

5. The flexible circuit board according to claim 1, wherein a projection of a side edge of the first support portion close to the first crimping portion on the flexible body is aligned with a boundary of the first crimping portion and the extension portion.

6. The flexible circuit board according to claim 5, wherein in a direction of the boundary, the width of the first support portion is equal to the width of the extension portion.

7. The flexible circuit board according to claim 1, wherein a projection of the second support portion on the first crimping portion covers all the regions on the first crimping portion except for a projection region of the first electrically connected structure.

8. The flexible circuit board according to claim 1, wherein the thickness of the second support portion is less than the thickness of the first electrically connected structure.

9. The flexible circuit board according to claim 1, wherein the support structure is an one-piece structure.

10. The flexible circuit board according to claim 1, wherein the support structure is of insulating materials.

11. The flexible circuit board according to claim 1, wherein the support structure is of flexible materials.

12. The flexible circuit board according to claim 11, wherein the materials of the support structure comprise silicone and rubber.

13. The flexible circuit board according to claim 1, wherein the support structure is laminated with the flexible body.

14. The flexible circuit board according to claim 1, wherein the substrate to be tested comprises a display substrate and a circuit board.

15. The flexible circuit board according to claim 1, wherein the substrate to be tested is a display substrate; the substrate to be tested comprises a third electrically connected structure arranged on the second crimping portion, the third electrically connected structure being an electrically connected structure for a display driver;
   the flexible body is provided with a notch avoiding the third electrically connected structure.

16. The flexible circuit board according to claim 15, wherein the second crimping portion is arranged at one end of the substrate to be tested in a first direction which is perpendicular to two opposite sides of the substrate to be tested; the second electrically connected structure comprises two-part connection terminals, where in a second direction orthogonal to the first direction, the two-part connection terminals are located at two sides of the third electrically connected structure respectively.

17. The flexible circuit board according to claim 16, wherein the notch is of a concave shape.

18. A test fixture comprising:
   a flexible circuit board comprising:
      a flexible body including a first crimping portion and an extension portion arranged successively in an extension direction, the first crimping portion is laminated with a second crimping portion of a substrate to be tested;
      a first electrically connected structure located on a first side of the flexible body, arranged on the first crimping portion, and laminated with a second electrically connected structure on the second crimping portion;
      a support structure located on the first side of the flexible body and includes a first support portion and a second support portion;
      wherein the first support portion is arranged on the extension portion and configured to support the extension portion in a state of laminating the first crimping portion with the second crimping portion,
      wherein levels of the extension portion and the first crimping portion are same;
   wherein the second support portion is arranged on the first crimping portion and configured to be supported between the first crimping portion and the second crimping portion in the state of laminating the first crimping portion with the second crimping portion to isolate the first crimping portion from the second crimping portion.

* * * * *